United States Patent
Sawtell et al.

(10) Patent No.: US 7,034,490 B2
(45) Date of Patent: Apr. 25, 2006

(54) MOTOR POSITIONING SERVO LOOP USING OVERSAMPLING BITSTREAM DAC

(75) Inventors: Carl K. Sawtell, San Jose, CA (US); Paolo Menegoli, San Jose, CA (US)

(73) Assignee: Acutechnology Semiconductor, San Jose, CA (US)

( * ) Notice: Subject to any disclaimer, the term of this patent is extended or adjusted under 35 U.S.C. 154(b) by 0 days.

(21) Appl. No.: 10/816,302

(22) Filed: Apr. 2, 2004

(65) Prior Publication Data

US 2004/0232868 A1    Nov. 25, 2004

Related U.S. Application Data

(60) Provisional application No. 60/471,558, filed on May 19, 2003.

(51) Int. Cl.
*G05B 19/16* (2006.01)

(52) U.S. Cl. ..................... 318/569; 318/560; 318/600; 318/603; 318/661

(58) Field of Classification Search ................ 318/569; 341/143
See application file for complete search history.

(56) References Cited

U.S. PATENT DOCUMENTS

| | | | |
|---|---|---|---|
| 5,284,342 A * | 2/1994 | Tanzer et al. ........... 273/121 A |
| 6,153,997 A * | 11/2000 | Kobayashi et al. ......... 318/560 |
| 6,154,017 A * | 11/2000 | Contreras ................ 323/315 |
| 6,202,198 B1 * | 3/2001 | Bibyk ......................... 716/17 |
| 6,204,988 B1 * | 3/2001 | Codilian et al. .............. 360/75 |
| 6,216,050 B1 | 4/2001 | Ono |
| 6,246,536 B1 * | 6/2001 | Galloway ................ 360/78.04 |
| 6,304,200 B1 * | 10/2001 | Masuda ...................... 341/144 |
| 6,417,639 B1 | 7/2002 | Schillaci |
| 6,456,450 B1 | 9/2002 | Lu et al. |
| 6,678,109 B1 | 1/2004 | Kagami |
| 6,724,249 B1 * | 4/2004 | Nilsson ....................... 330/10 |
| 6,735,540 B1 * | 5/2004 | Pedrazzini et al. .......... 702/79 |
| 6,842,070 B1 * | 1/2005 | Nilsson ....................... 330/10 |
| 2004/0090277 A1 * | 5/2004 | Tsyrganovich ............... 331/74 |

* cited by examiner

*Primary Examiner*—David Martin
*Assistant Examiner*—Erick Glass (57) ABSTRACT

A Hard Disk Drive VCM positioning servo loop comprises an oversampling bitstream Digital to Analog converter. The oversampling DAC is a sigma-delta converter which yields higher resolution and lower noise than Nyquist-rate DACs. This allows driving the VCM with finer level of current control for higher track density. This approach can be implemented in the VCM driver chip ("combo chip") or in the microprocessor device either in hardware or in software, reducing significantly the development and manufacturing cost. Furthermore this approach can be utilized in combination with a VCM actuation method known as "voltage mode drive" wherein the output of the sigma-delta converter represents the voltage to be applied directly to the VCM actuator. Furthermore this approach can be utilized for optical data storage motor positioning servo loops or any other motor positioning servo loops where high dynamic and resolution is needed.

12 Claims, 9 Drawing Sheets

MOTOR POSITIONING SERVO LOOP USING OVERSAMPLING BITSTREAM DAC

RELATED APPLICATION DATA

The present application claims priority from U.S. Provisional Patent Application No. 60/471,558 for HARD DISK VCM SERVO LOOP USING SIGMA-DELTA DIGITAL BITSTREAM DAC filed on May 19th 2003.

BACKGROUND OF THE INVENTION

1. Field of the Invention

The present invention is in the field of motor controller and positioning servo loops. The present invention further relates to Hard Disk Drive and optical data storage devices. The present invention further relates to methods and circuits for controlling a voice coil motor for positioning the read/write head of a hard disk drive. The implementation is not limited to a specific technology, and applies to either the invention as an individual component or to inclusion of the present invention within larger systems which may be combined into a larger integrated circuit.

The invention also falls within the field of Digital to Analog Converters and more specifically, the invention falls into the class of converters referred to as oversampling Digital to Analog and Analog to Digital Converters.

2. Brief Description of Related Art

Figure 1:
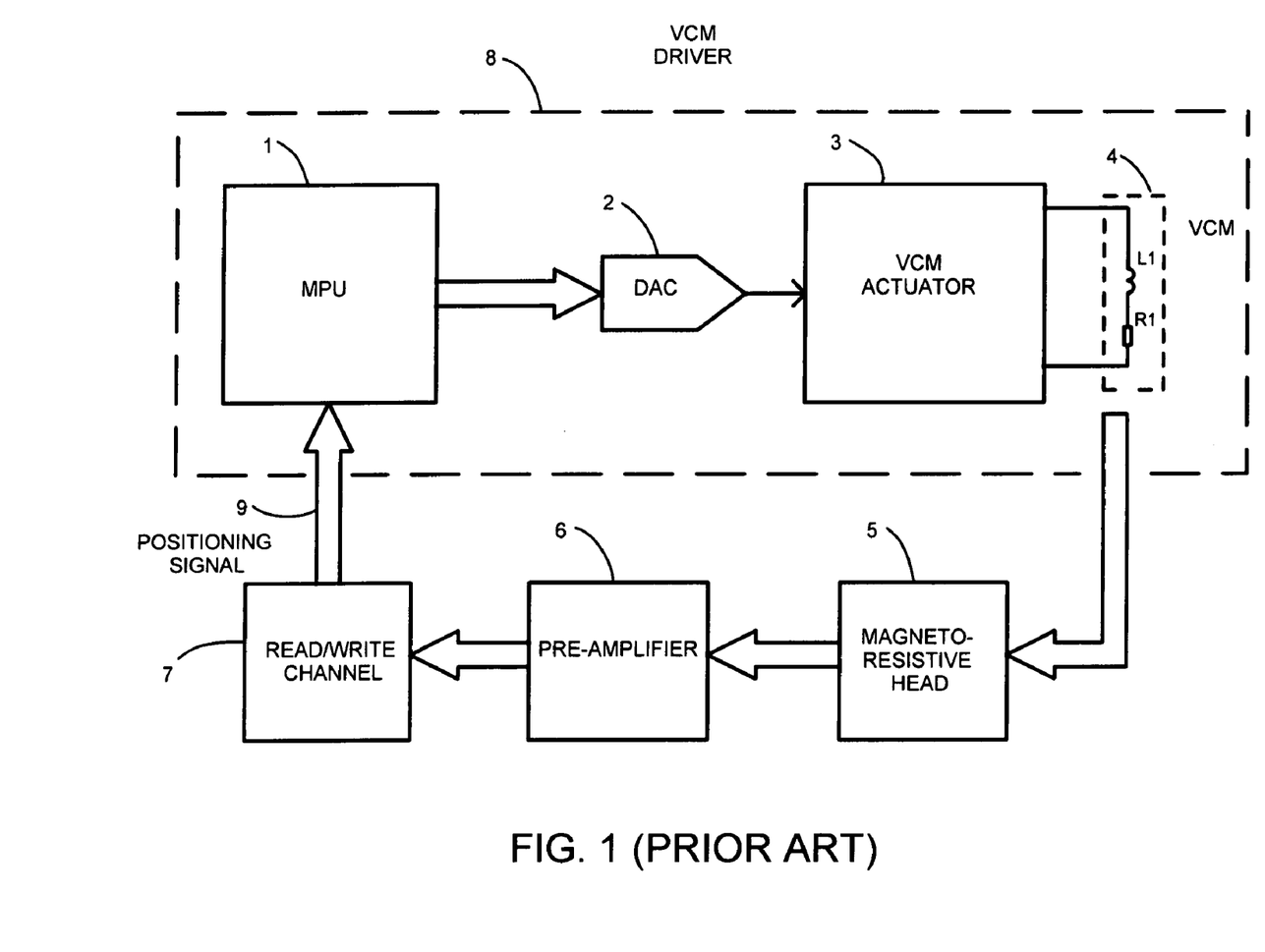
FIG. 1 is a general block diagram showing the prior art of the entire disk drive servo loop.

The position of the read/write head of a disk drive is typically controlled by a linear motor, often referred to as the Voice Coil Motor (VCM). The VCM 4, as shown in FIG. 1, is represented as an inductor L1 in series to a resistor R1 to indicate the main electrical parameters of the motor. The VCM is driven in response to a control loop, known as the servo loop, whose main algorithm is implemented typically within a microprocessor 1 or similar digital processor, and is typically driven in at least three different modes.

A "seek" mode causes the read/write head to move from one track on the disk to a potentially unrelated track, which may require a significant motion. In this mode, the control system typically attempts to control the velocity of the mechanism. In a "track follow" mode, the read/write head is relatively stationary, and the control system works to control its precise position to be directly above the appropriate track. In a third mode, the head is driven onto or off of the disk surface to a "park" position, typically using a mechanical ramp to pull the head above the plane of the disk.

As shown in FIG. 1, the servo positioning control loop comprises a microprocessor 1 that contains the main servo algorithm and that drives, with digital signals, a digital to analog converter (DAC) 2. This DAC 2 typically drives a VCM actuator 3 in its various forms and implementations. The VCM actuator 3 commands the current into the VCM 4 which defines its arm's velocity and position on the disk surface. A magneto-resistive head 5, situated on the extremity of the VCM arm, and a pre-amplifier device 6, located next to the head, detect and amplify the electrical pulses associated with the magnetic data written on the disk.

The signal from the pre-amplifier is fed into the read-write channel device 7 that deciphers the pulses and converts them into digital words for the microprocessor 1. These digital words include the data written to and read from the disk and the positioning signal 9. Ono et al. (U.S. Pat. No. 6,216,050) shows an equivalent solution.

Figure 2:
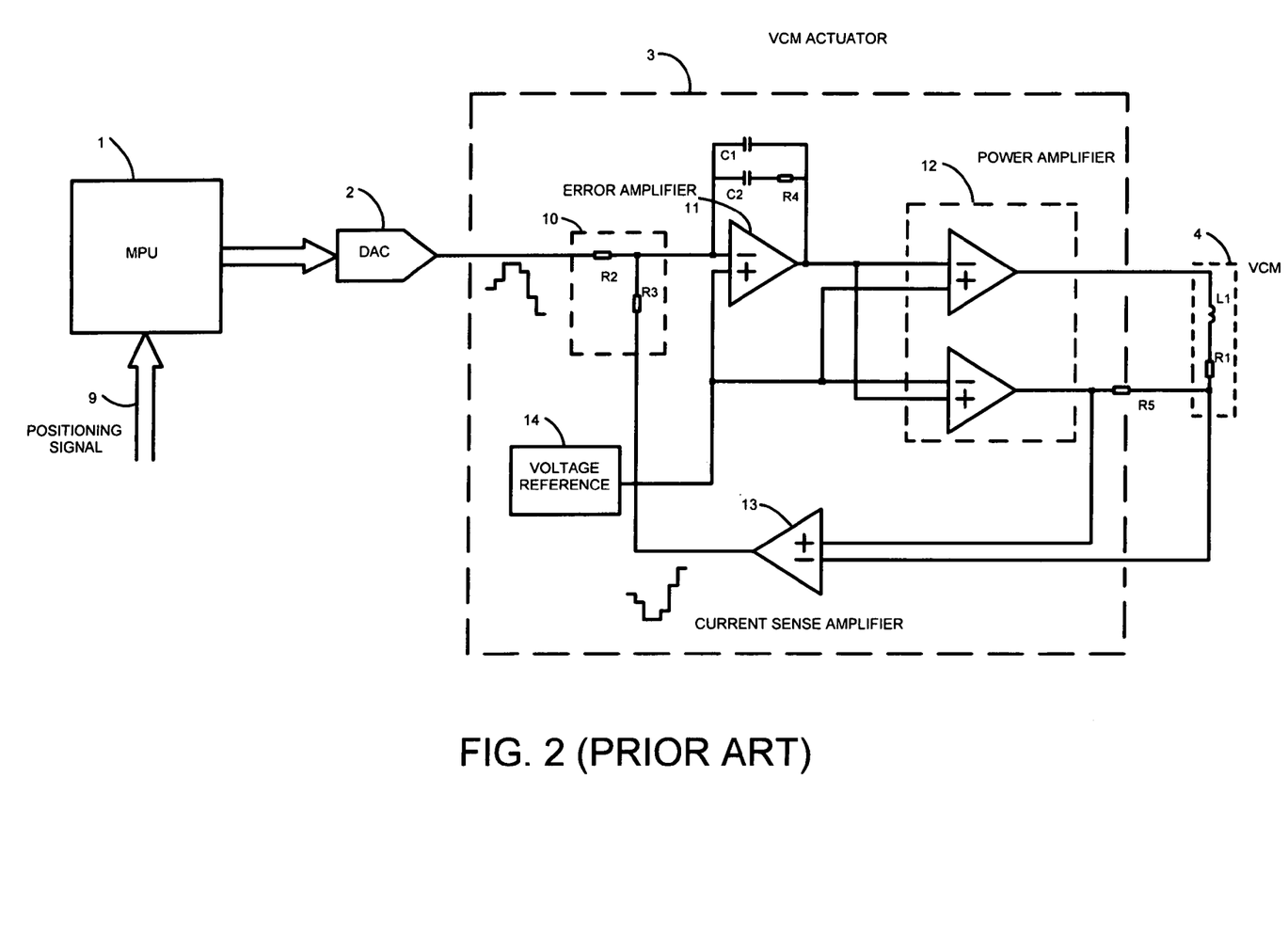
FIG. 2 is a circuit diagram showing a more detailed implementation of the prior art for the section of interest of the VCM positioning control servo loop defined in the FIG. 1 as VCM driver.

In addition to the servo loop there is typically an inner analog current control loop that drives the VCM as shown in more details in FIG. 2. The microprocessor 1 drives a Digital to Analog converter 2 which, in its turn, commands the current through the inner current control loop. In this case the VCM actuator block 3 comprises the inner analog current control loop to regulate the current into the VCM 4.

In order to give optimal control, the overall servo loop commands a particular current to be driven into the VCM, and an inner analog control loop actually regulates the current. Practical circuit implementation considerations require that the VCM be driven with conventional amplifiers which force a voltage across the VCM. The local analog control loop senses the current in the VCM, compares it to the commanded current, and adjusts the drive voltage to maintain the desired current.

The inner analog loop is driven by a DAC 2 creating an analog representation of the digitally commanded current, and a Current Sense Amplifier (CSA) 13 generates a signal representing the value of the VCM current. These two signals are summed out of phase in summer 10, such that its output is the error in the present value of the current.

The summer 10 output feeds an amplifier stage generally referred to as the error amplifier 11. This stage is conventionally an integrator, with arbitrarily high gain at DC but with gain falling with frequency to maintain the stability of the loop at higher frequencies. This stage might also implement additional frequency/phase shaping for stability. The output of error amplifier 11 feeds the VCM power amplifier 12, typically two anti-phase linear amplifiers, connected as a "full bridge" capable of imposing the full supply voltage across the load in either polarity. In series with the VCM 4 there is a small resistor R5 used to sense current. The voltage across this current sense resistor R5 is used as the differential input to the current sense amplifier 13. Schillaci et al. (U.S. Pat. No. 6,417,639) provided an equivalent solution.

Within this loop, the error amplifier is a standard operational amplifier. Small DC errors can be initialized out of the loop with software, and the AC requirements are easily met with conventional design techniques. The VCM power amplifier 12 is similarly very conventional in design, and is not appreciably different from an audio amplifier used to drive a loudspeaker load. Because it is embedded within the high gain inner loop, this stage does not contribute to errors in the servo loop.

The two components of this analog loop that require precision analog design are the current sense amplifier and the DAC. The current sense amplifier's DC error may be calibrated out of the system through parameters in the overall digital control loop. But a large common mode error would be difficult to similarly calibrate out. As the VCM is driven through the extremes of its range, the small signal across the sense resistor also is moved common mode through the entire range. Any failure in the current sense amplifier to reject this common mode signal will result in false detection of VCM current.

The DAC is typically on the order of 12–14 bits, representing a total dynamic range of 70–80 dB. This dynamic range is critical in order to be able to control both very large currents needed to sweep the head across the disk quickly and to control the head position without error over a very small final position (within the disk track). The design of conventional DACs (also known as Nyquist-rate DACs) with this resolution is well known in the art, but the appropriate design techniques take up considerable silicon and nevertheless may have a finite yield loss when tested for accuracy. For high accuracy and speed, standard techniques also consume significant power. The testing of the main parameters of the DACs (like integral and differential nonlinearity and monotonicity), also represents a considerable cost in the manufacturing process.

The overall analog control system, including DAC, current sense amplifier, error amplifier and power amps is typically implemented on a single chip, as in Kagami et al. (U.S. Pat. No. 6,678,109), usually along with the control and power for the disk's spindle motor and any other analog/power functions required in the chip. The resultant "combo chip" has a yield which is a product of the yield of all of the subsystems, so any subsystem which carries a risk of yield loss due to performance variation is of great concern in the analysis of system cost.

It is well known in the art that the DAC can be replaced with a pulse-width modulated signal. Such a PWM DAC was common in the past when system requirements were significantly reduced compared to modern systems. In order to pass a particular signal bandwidth, a PWM waveform that switches somewhat faster than twice that rate must be developed. In order to simply generate a PWM waveform from an n-bit binary word, a clock $2^n$ times the switching frequency is needed. If, for instance, it were desired to use a PWM waveform at 20 kHz (so as to be at frequencies higher than the audible band) and to be 14 bits, the required digital clock would need to be 328 MHz, which is a plausible but not entirely practical. This modulation would create a signal, including the desired base-band component, plus the spectrum of a large signal switching waveform at 20 kHz with many harmonics up to very high frequency.

It is also known, that in signal conversion fields, where high accuracy and signal dynamic are necessary, alternate "oversampling" converters and more specifically "one-bit" converters have significant advantage over simple PWM schemes. One of these schemes is the sigma-delta modulator, also known as a delta-sigma modulator. The sigma-delta modulator is, in its most conventional form, a servo loop that controls an analog bitstream such that its average value (between output low and output high) is forced to be proportional to an analog input value. This generally forms an analog to digital conversion. Traditionally in an analog to digital converter, the single bit high frequency bitstream is then processed through digital filtering to create a multibit low frequency data-stream.

It is also known that this sigma-delta architecture can be used to convert a digital input into the same output bitstream by replacing the servo loop with direct digital implementations of the same loop, giving a conversion from a relative low frequency sequence of multi-bit digital values (analogous to the analog input) to a higher frequency single bit bitstream that has a time average value proportional to the input numerical values.

Unlike the PWM coder which has a dynamic range proportional to the ratio of the high frequency clock to the switching frequency (the over-sampling ratio, OSR), the sigma-delta converter has a dynamic range that increases with the over-sampling ratio raised to the power of 1.5. Higher order loops, which contain cascades of integrator stages, further increase the rate at which dynamic range increases with OSR.

A high frequency bitstream that is 1000 times the highest frequency of interest can have a signal to noise ratio (SNR) of 90 dB with a first order sigma-delta, whereas for the PWM DAC would be only 60 dB. The high frequency out-of-band noise in the PWM signal would be centered at twice the maximum signal frequency, the high frequency noise in the sigma-delta case is effectively random noise that increases with frequency and then is spread evenly across a wide bandwidth, easily filtered from the main signal.

In the Hard Disk Drive (HDD) systems the density of the magnetic data recorded on the disk is increasing very rapidly and that is translated in the number of rotational tracks per inch on the disk surface. The tracks containing the magnetic data are consequently getting narrower and the burden to stay on track with limited Bit Error Rate (BER) during normal operation, is shifted to the ability to control the position of the head on the disk with increasing accuracy.

Accordingly, what is needed is a VCM DAC that is cost-effective, easier to implement and with better performance in terms of dynamic range in order to improve the control of VCM and, consequently, the control of the position of the read/write head on the disk.

SUMMARY OF THE INVENTION

It is an object of the present invention to provide a servo loop that improves upon the accuracy and resolution of the motor positioning servo loop. Because of the oversampling nature of the DAC converter, this present invention improves significantly upon the dynamic and resolution of the positioning control loop. One of the main advantages of the described configuration is also the fact that, independently of its implementation, it represents a much more cost-effective solution because of the reduced silicon area, higher yield and simplified testability.

It is another object of the present invention to utilize an oversampling converter in a motor positioning servo loop that can be a purely digital circuit that converts the multi-bit digital control values into a one-bit digital bitstream. This digital circuit can be of the type known as sigma delta or delta sigma.

The time average value of the bitstream represents the analog value to be commanded to the servo loop, and the design of the servo loop will reject the high frequency components of the bitstream. This rejection of high frequency components does not require a filter between the DAC and the error amplifier, so no added latency (delay) is added to the loop.

In particular when applied to the field of the Hard Disk Drive VCM positioning servo loop, the most general embodiment for the VCM driver using the sigma-delta digital bitstream comprises a microprocessor device to send sampled digital values to the sigma-delta converter. The output of the converter is represented by the one bit bitstream that is representing the VCM drive value required and it is an input to the VCM actuator.

The VCM actuator may be implemented in many forms, the most common being the one where the VCM actuator constitutes a current control loop in order to drive the VCM in "current mode". Nonetheless the VCM actuator may also be configured to drive the VCM in "voltage mode".

The output of the sigma-delta modulator is an analog signal, and it may be adequately filtered to eliminate the high frequency components of the signal.

As is clear to those skilled in the art, this basic system can be implemented in many specific ways, and the above description is not meant to designate a specific implementation. Analogous known techniques make use of analog sigma-delta modulators or higher order sigma-delta modulators in various configurations. However it is clear that the implementation of the modulator in purely digital form allows the precision analog circuitry of the DAC to be replaced by digital circuit.

In further embodiments of the present invention, the oversampling converter can be implemented in the motor actuation chip, also known as "combo chip" or in the controller chip, where the main microprocessor unit is located. When implemented in the controller chip, the oversampling modulator can be implemented in hardware or in software.

The one-bit bitstream can also be fed into the analog current control loop as simple digital levels. This has the disadvantage of having minimal rejection of power supply voltages and may introduce digital noise into the loop. But as both the power supply variations and logic noise will tend to be outside of the bandwidth of the loop, these will have minimal system impact.

The primary need for a wide dynamic range is to get very fine resolution, and that resolution will be achieved even if absolute accuracy is compromised. Alternatively, conventional means can be used to switch between two fixed reference values as commanded by the two values of the bitstream.

In a switched capacitor realization, a fixed charge (capacitor charged to reference voltage) is input to the error amplifier of the VCM current control loop every cycle, with its polarity determined by the bitstream. Although these two approaches could be described as being one-bit DACs, there is no precision circuitry that leads to the level of complexity or possible yield loss as in a more conventional Nyquist-rate multi-bit DAC.

In practice, the VCM control loop will have a bandwidth on the order of 30 kiloHertz, and the bitstream frequency will be several hundreds of kiloHertz to a few MegaHertz, so the high frequency content of the bitstream is well out of the band of the loop. It is not strictly necessary to filter the bitstream before inserting it into the loop. In order to reduce the large AC magnitude at the input of the error amp, it may be desirable to do some small amount of filtering, but this can be a single RC pole well out of band. This is conceptually quite different than similar filtering in a PWM DAC scheme, where the filtering must be above the highest signal frequency but provide significant attenuation at the switching frequency, and these two frequencies are of the same order of magnitude.

BRIEF DESCRIPTION OF THE DRAWINGS

Further details of the present invention are explained with the help of the attached drawings in which.

DETAILED DESCRIPTION OF SPECIFIC EMBODIMENTS

Figure 3:
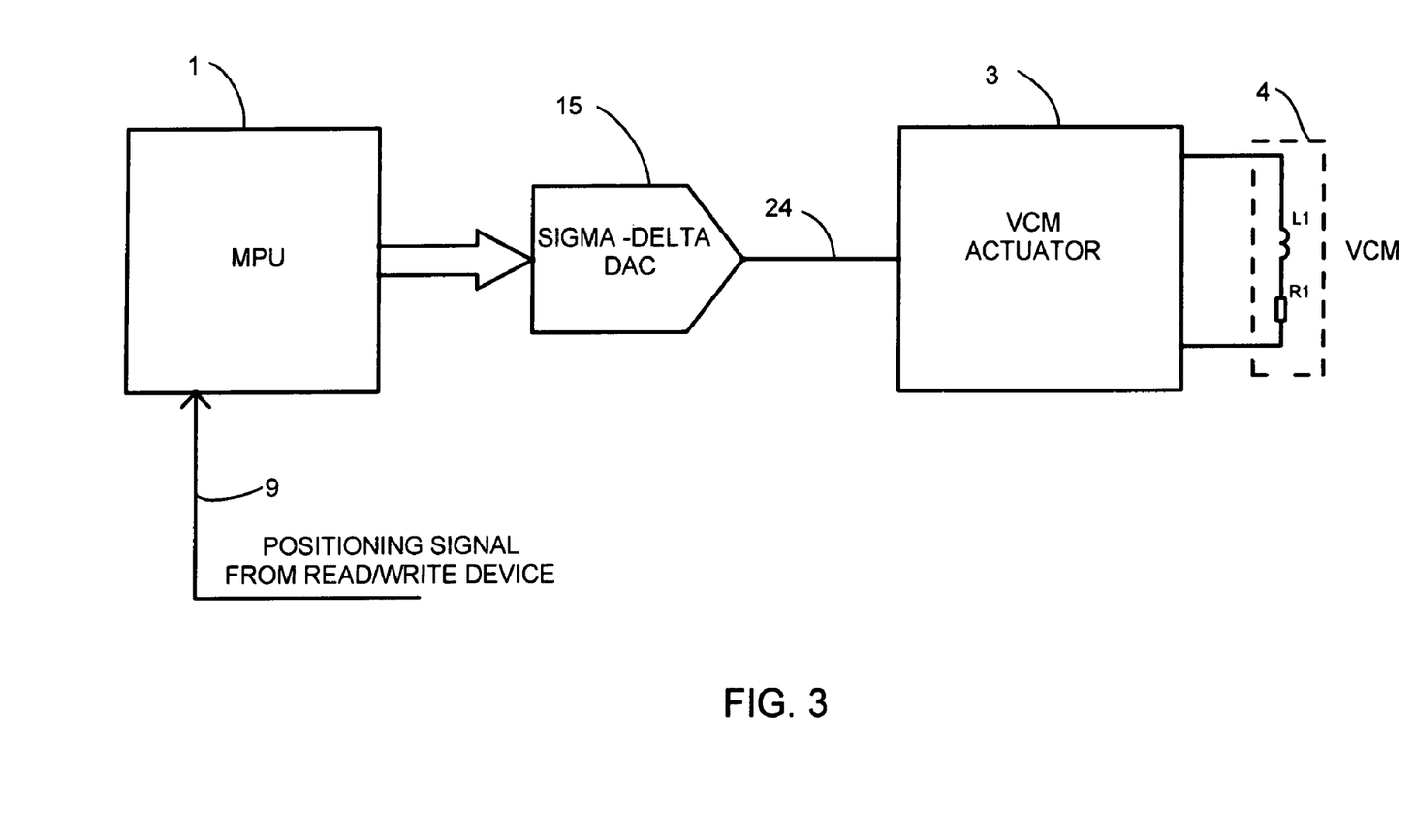
FIG. 3 is a block diagram showing a general implementation of the VCM driver section of the positioning control servo loop utilizing the sigma-delta converter in accordance to the present invention.

A. FIG. 3

FIG. 3 shows the most general embodiment for the VCM driver section of the servo loop utilizing the sigma-delta Digital to Analog converter 15.

The position of the head on the disk is controlled by the servo loop regulating the current in the VCM 4. The shown VCM driver comprises a microprocessor 1 that feeds digital signals to the sigma-delta DAC 15, and a VCM actuator 3 that drives the VCM 4 in order to set the velocity and position of the head on the disk.

According to the embodiment of the present invention, a sigma-delta converter 15 replaces the more conventional Nyquist-rate multi-bit DAC in its various configurations. The microprocessor 1 processes the signal 9 coming from a read/write channel device and its output is a digital signal, that represents the analog value of the voltage or of the current to determine the position of the VCM.

Figure 4:
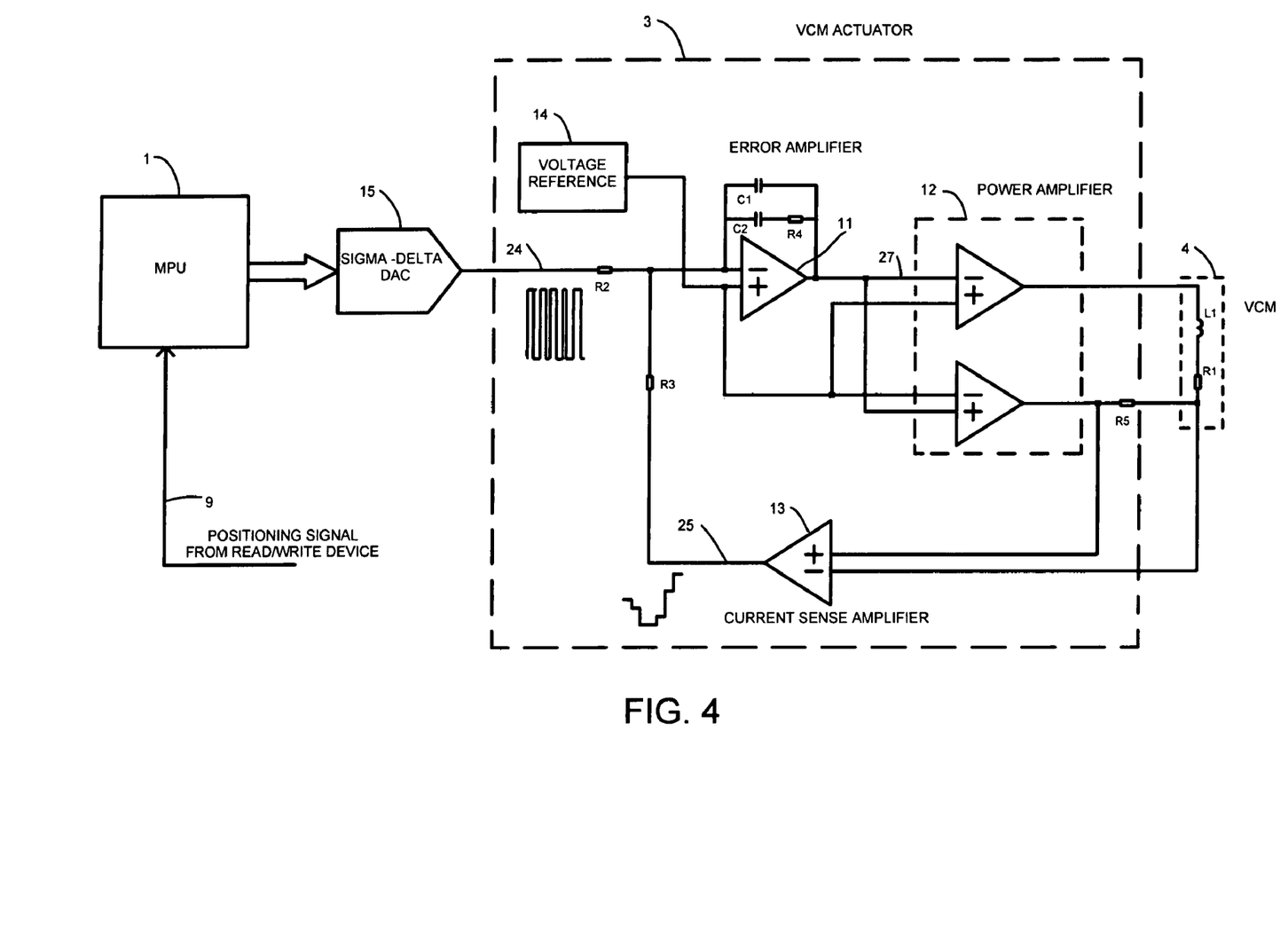
FIG. 4 is a general block diagram showing a detailed implementation of the VCM actuator utilizing the sigma-delta Digital to Analog converter in accordance to the present invention.

B. FIG. 4

FIG. 4 displays another embodiment of the present invention for the VCM driver section of the servo loop including the sigma-delta digital to analog converter 15.

The position of the head on the disk is controlled by the servo loop regulating the current in the VCM 4. The shown VCM driver comprises a microprocessor 1 that feeds digital signals to the sigma-delta DAC 15, and a VCM actuator 3 that regulates the current into the VCM 4 in order to set the velocity and position of the head on the disk. The VCM current control loop of the VCM actuator 3 comprises a voltage reference 14, which is used to set the common mode voltage of the current control loop, an error amplifier 11, a sense amplifier 13, a power amplifier 12 and a Voice Coil Motor (VCM) 4.

According to the embodiment of the present invention, a sigma-delta converter 15 replaces the more conventional Nyquist-rate multi-bit DAC in its various configurations. The microprocessor 1 processes the signal 9 coming from a read/write channel device and the resulting signal represents the analog value of the current to determine the position of the VCM 4. The sigma-delta converter output 24, which is typically in the form of a bitstream, is an analog representation of the current to be regulated in the VCM.

The one-bit bitstream, output 24 of the sigma-delta converter 15 is then summed through the resistors R2 and R3 with the output 25 of the current sense amplifier 13 to the inverting input of the error amplifier 11 which, in its turn, drives the power amplifier 12 representing the output stage of the "combo chip". The power amplifier 12 converts the single-ended signal from the output 27 of the error amplifier 11 into a differential signal to drive the VCM 4. The power amplifier 12 drives directly the VCM 4 to move the read-write head over the disk surface.

The current into the VCM 4 is then sensed across the resistor R5. The current sense amplifier 13 is generally a closed loop amplifier with fixed DC gain to convert the differential voltage across the resistor R5 into a voltage applied to one end of the resistor R3. The resistor R3 and R2 define the DC gain of the system. If R2 and R3 are chosen of the same value, then the output of the sense amplifier 13 has to have the same amplitude of the DAC 15 output 24 representing the regulated VCM current. The passive components C1, C2 and R4 in feedback to the error amplifier 13 are utilized to compensate the system in order to guarantee stability in all the conditions.

Figure 5:
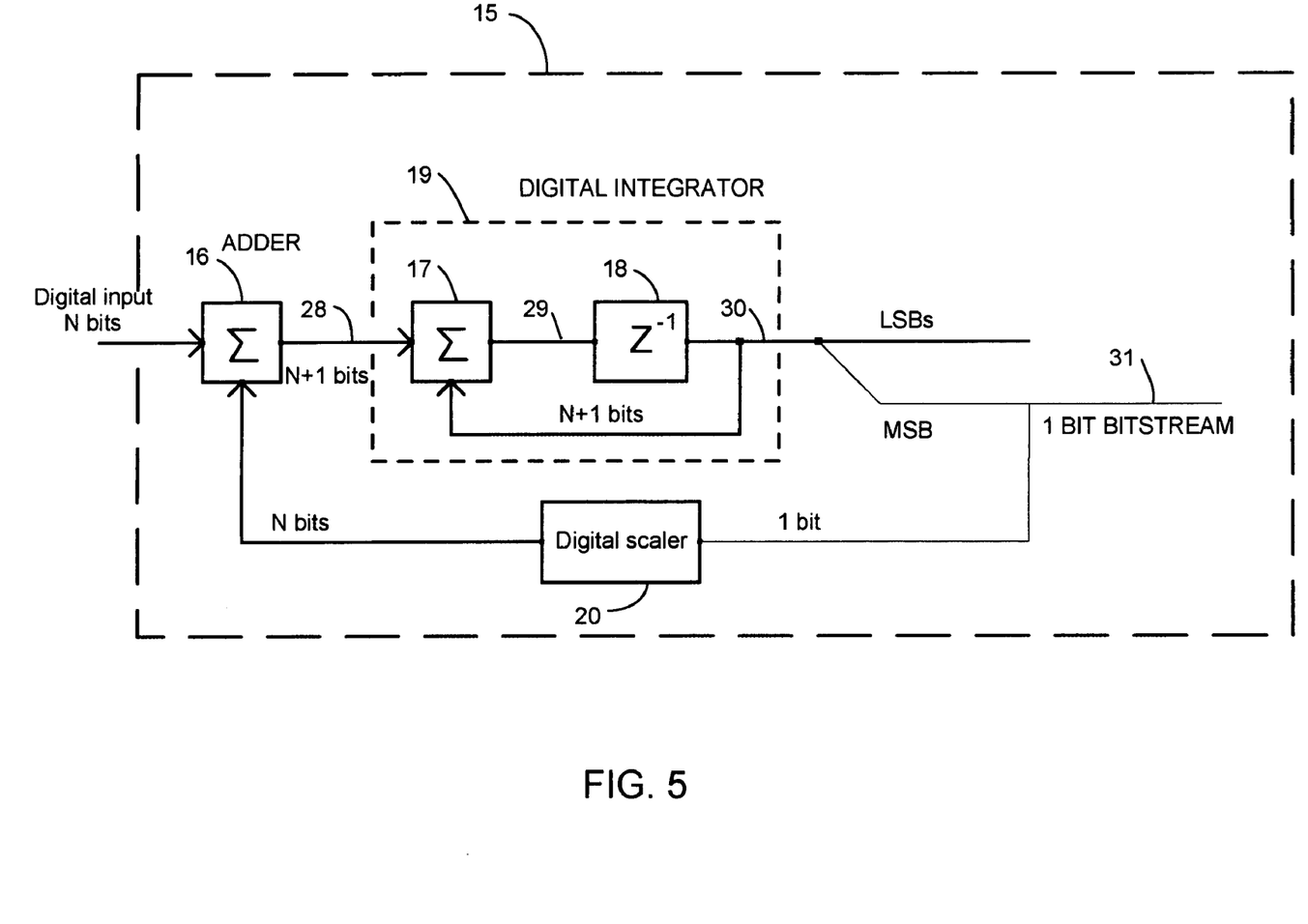
FIG. 5 is a general circuit diagram showing a first order digital sigma-delta modulator according to the present invention.

C. FIG. 5

FIG. 5 represents the general embodiment for the first order digital sigma-delta modulator 15.

The first order sigma Delta modulator, as shown in FIG. 5, comprises a first adder 16, a second adder 17, a memory element 18 and a digital scaler 20. The first adder 16 receives a sampled digital value, of length N (typically of 12 to 16 bits), which represents the value of current to be used to drive the VCM. This value is fed to one input of a summing circuit 16, a first adder, which adds the value of two inputs to arrive at an output digital value of length N+1.

The output 28 of the first adder 16 feeds the input of a digital integration stage 19, typically implemented by a second adder 17 and a storage element (latch) 18. The storage element input is the output 29 of the second adder 17, which adds the present input value to the previous value stored in the storage element.

The output 30 of the storage element 18 represents also the output of the integrator 19. The output of the integrator 19 is compared to a reference value to define a one-bit digital output, typically by stripping out and using only the MSB. This one-bit value 31 is used as the output of the modulator digitally scaled to generate an N-bit digital input to the second input of the first adder 16.

This digital sigma-delta modulator 15 is clocked by a signal running at a high enough frequency to guarantee an adequate oversampling ratio. The output 31 of the sigma-delta modulator shown in FIG. 5 is the one-bit bitstream signal. The output 31 of the sigma-delta modulator represents an analog signal, but it may be adequately filtered to eliminate some high frequency components.

As is clear to those skilled in the art, this basic system can be implemented in many ways, and the above description is not meant to designate a specific implementation. Analogous known techniques make use of oversampling converters and analog sigma-delta modulators or higher order sigma-delta modulators in various configurations. However it is clear that the implementation of the modulator in purely digital form allows the precision analog circuitry of the DAC to be replaced by digital circuit.

Figure 6:
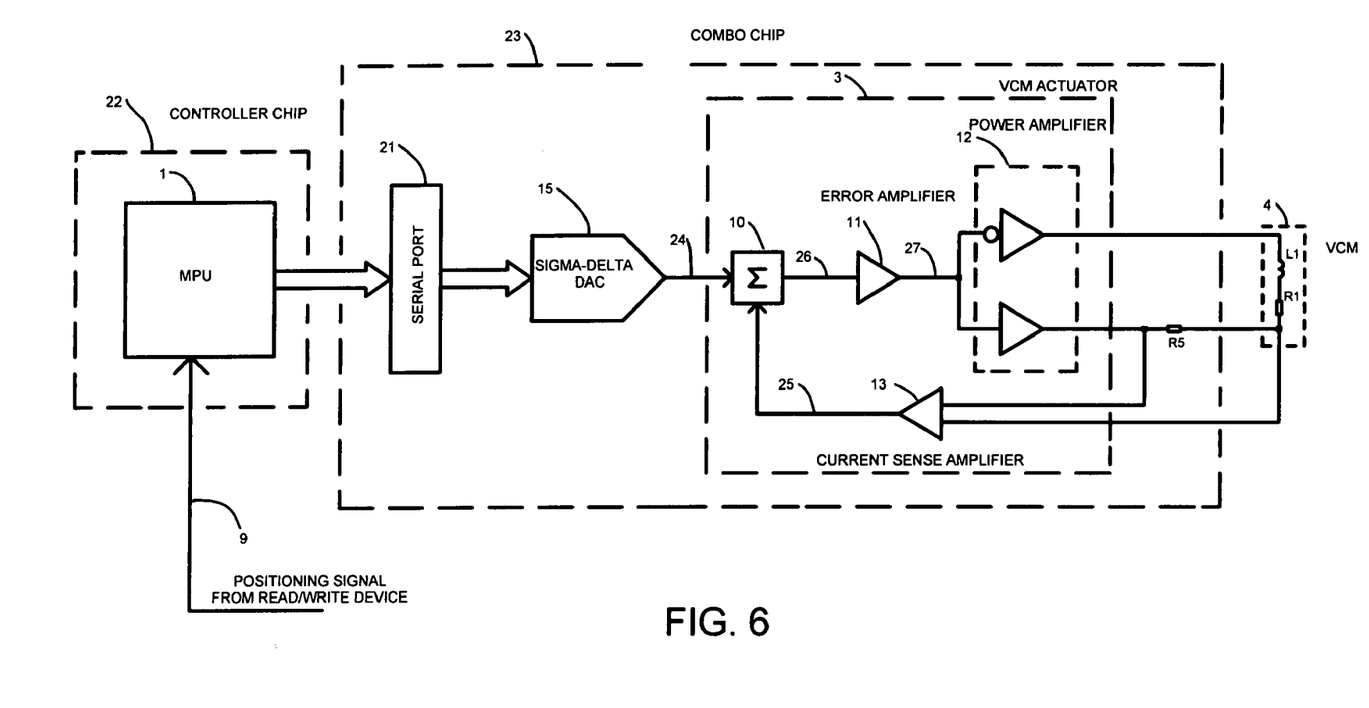
FIG. 6 is a block diagram showing the VCM driver including the sigma-delta converter within the "combo chip" in accordance to the present invention.

D. FIG. 6

FIG. 6 represents the preferred embodiment for the VCM driver section of the servo loop including the sigma-delta digital to analog converter within the "combo chip".

The VCM driver comprises a controller chip 22 that feeds digital signals to the "combo chip" 23. The controller chip 22 comprises a microprocessor 1. Furthermore the "combo chip" 23 comprises a serial port 21, a sigma-delta DAC 15 and a VCM actuator 3. The VCM actuator 3 comprises a summer 10, an error amplifier 11, a sense amplifier 13, and a power amplifier 12. The digital signals from the microprocessor 1 are the input of a serial port 21 which, in turn, feeds the sigma-delta DAC 15.

The sigma-delta converter 15 is used in place of the more conventional multi-bit DAC (also called Nyquist-rate DAC) in its various configurations. The microprocessor 1 processes the head positioning signal 9 coming from a read/write channel device and the resulting signal, that represents the analog value of the current to determine the position of the VCM 4, is fed through the serial port 21 to the sigma-delta converter 15.

The output 24 of the sigma-delta converter 15 is then summed, by the summer 10, with the output 25 of the current sense amplifier 13. The output 26 of the summing device 10 is then fed to the input of the error amplifier 11 which, in its turn, drives the power amplifier 12 representing the output stage of the "combo chip" 23. The power amplifier 12 converts the single ended signal from the output 27 of the error amplifier 11 into a differential signal to drive the VCM 4. The power amplifier 12 drives directly the VCM 4 to move the read/write head over the disk surface. The current into the VCM 4 is then sensed across the sense resistor R5. The current sense amplifier 13 is generally a closed loop amplifier with fixed DC gain to convert the differential voltage across the sense resistor into a single ended voltage.

The loop comprising the summer 10, the error amplifier 11, the power amplifier 12, the VCM 4 and the current sense amplifier 13 constitutes the VCM current control loop. The analog signal 24 at the first input of the summer 10 is setting the current to be regulated by this VCM current control loop into the Voice Coil Motor 4. According to this embodiment the sigma-delta converter 15 is implemented in the "combo chip" 23.

Figure 7:
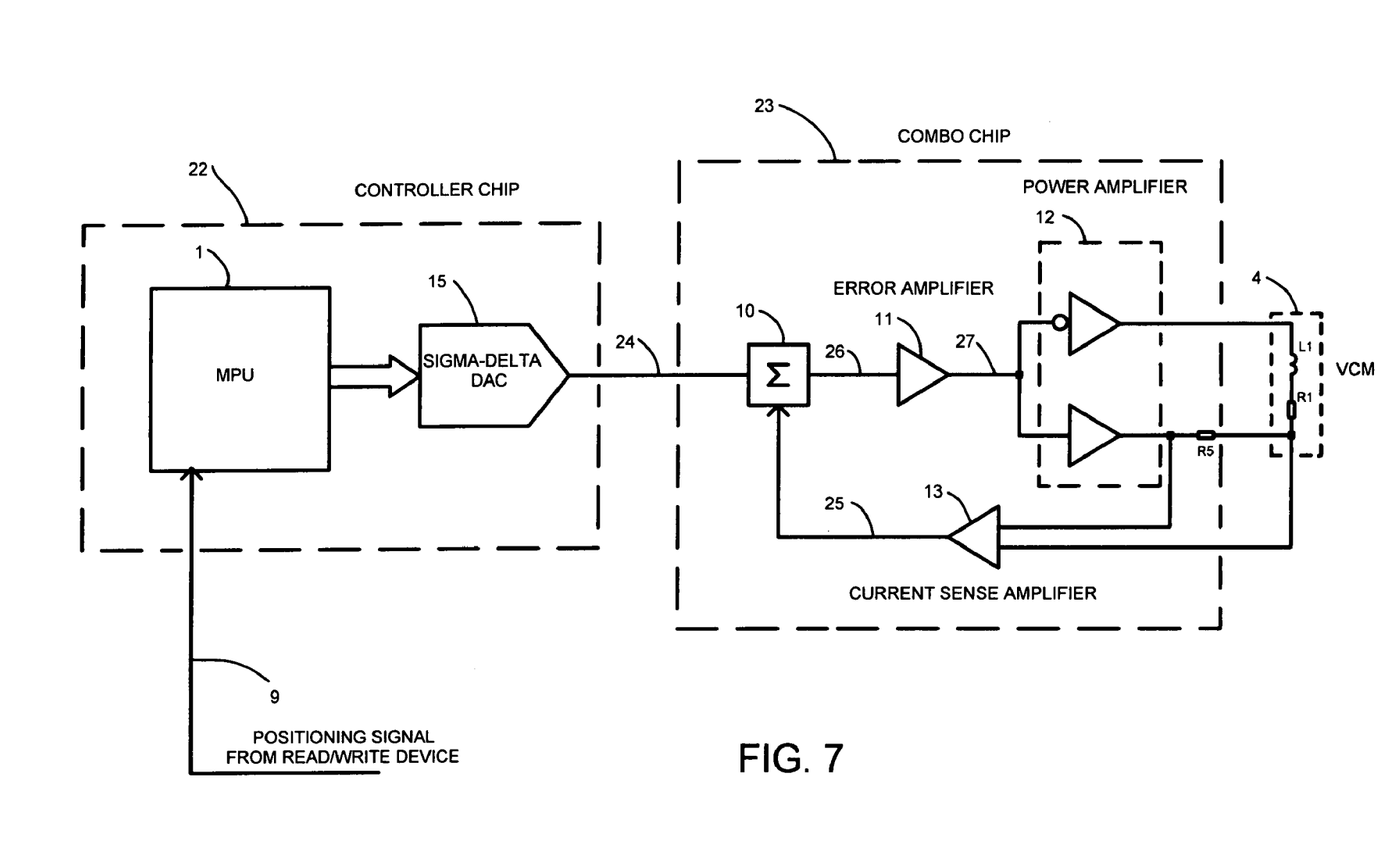
FIG. 7 is a block diagram showing the VCM driver section of the servo loop including the sigma-delta converter implemented within the controller chip in accordance to the present invention.

E. FIG. 7

FIG. 7 displays another embodiment of the present invention for the VCM driver section of the servo loop that includes the sigma-delta digital to analog converter 15 within the controller chip 22.

The VCM driver comprises a controller chip 22, a "combo chip" 23 and a VCM 4. The controller chip 22, according to this embodiment, includes a microprocessor 1 and the sigma-delta converter 15. The output 24 of the sigma-delta converter 15 is an input for the "combo chip" 23 and it represents the first input for the summer 10. Furthermore the "combo chip" 23 comprises an error amplifier 11, a sense amplifier 13, and a power amplifier 12.

The sigma-delta converter 15 is used in place of the more conventional multi-bit DAC (also known as Nyquist-rate converter) in its various configurations typically part of the "combo chip" 23 or the PWM DAC implemented in the controller chip 22 with an external low pass filter. The microprocessor 1 processes the head positioning signal 9 from a read/write channel device and the resulting signal represents the analog value of the current to determine the position of the VCM 4.

The output 24 of the sigma-delta converter 15, which is typically a signal in the form of a bitstream, is an output for the controller chip 22 and an input for the "combo chip" 23. It is summed, by the summer 10, with the output 25 of the current sense amplifier 13. The output 26 of the summer 10 is then fed to the input of the error amplifier 11 which, in its turn, drives the power amplifier 12 representing the output stage of the "combo chip" 23. The power amplifier 12 converts the single ended signal from the output 27 of the error amplifier 11 into a differential signal to drive the VCM 4. The power amplifier 12 drives directly the VCM 4 to move the read/write head over the disk surface. The current into the VCM 4 is then sensed across the sense resistor R5. The current sense amplifier 13 is generally a closed loop amplifier with fixed DC gain to convert the differential voltage across the sense resistor into a single ended voltage.

The analog signal at the first input of the summer 10 is setting the regulated current into the Voice Coil Motor 4. According to this embodiment the sigma-delta converter 15 is partitioned within of the controller chip 22.

Figure 8:
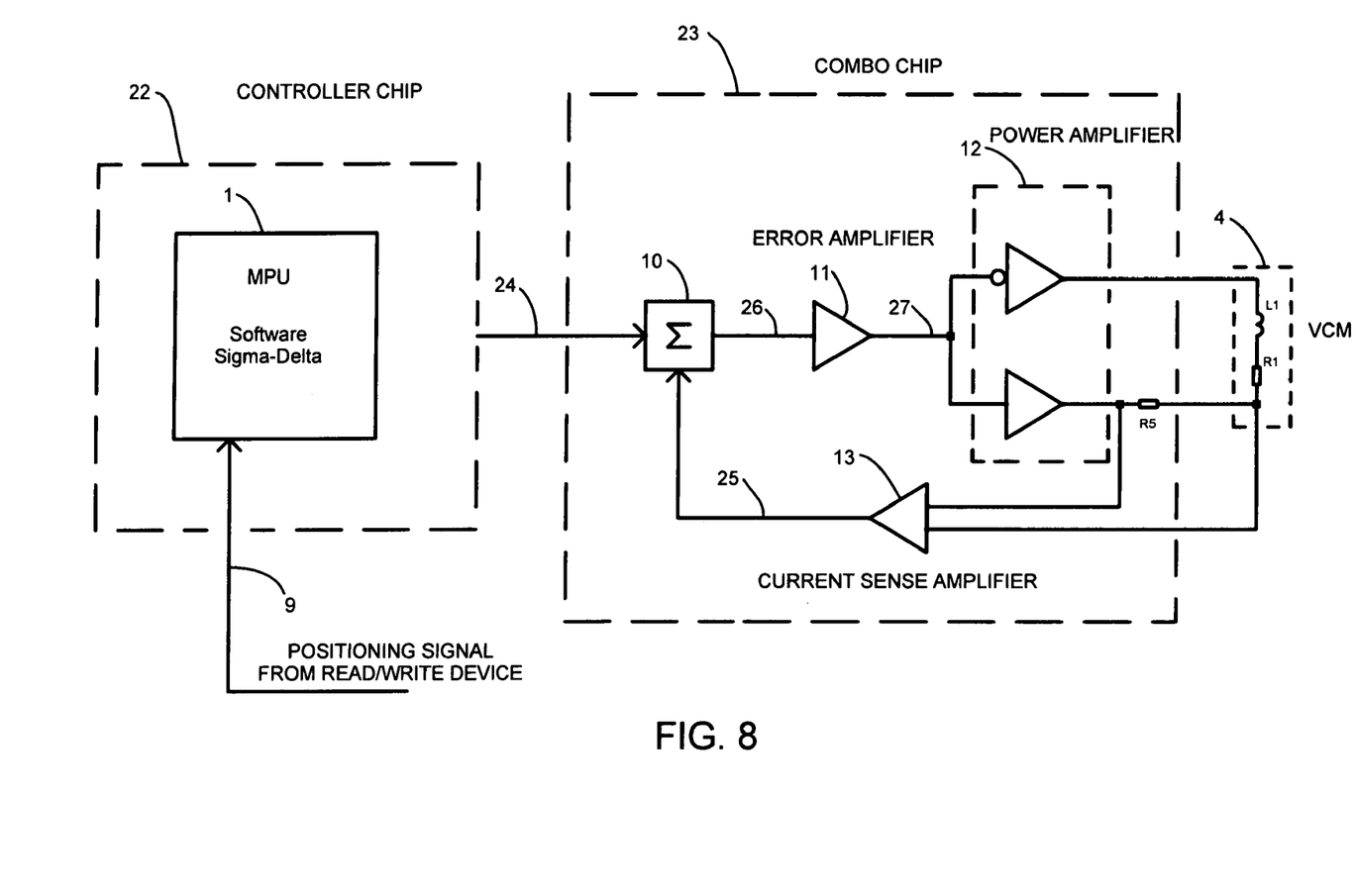
FIG. 8 is a block diagram showing the VCM driver section of the servo loop including the sigma-delta converter implemented in software within the controller chip in accordance to the present invention.

F. FIG. 8

FIG. 8 shows one alternative embodiment of the present invention for the VCM driver including the sigma-delta digital to analog converter wherein the digital sigma-delta modulator function is implemented in software within the controller chip 22.

The VCM driver section of the positioning control servo loop comprises a controller chip 22, a "combo chip" 23 and a VCM 4. The controller chip 22, according to this embodiment, includes a microprocessor 1 within which the sigma-delta digital modulator function is implemented in software. The one-bit bitstream output may be successively filtered to eliminate the high frequency components of the signal or directly fed to the "combo chip" 23. Furthermore the "combo chip" 23 comprises a summer 10, an error amplifier 11, a sense amplifier 13, and a power amplifier 12.

The software implementation of the sigma-delta modulator replaces the more conventional multi-bit DAC (also known as Nyquist-rate DAC) in its various configurations, typically part of the "combo chip" 23, or the PWM DAC implemented in the controller chip 22 with an external low pass filter. The microprocessor 1, that in this implementation includes the sigma-delta modulator, processes the head-positioning signal 9 from a read/write channel device and the resulting signal represents the analog value of the current to determine the position of the VCM 4.

The output 24 of the controller chip 22 is an input for the "combo chip" 23 and it is summed, by the summer 10, with the output 25 of the current sense amplifier 13. The output 26 of the summing device 10 is then fed to the input of the error amplifier 11 which, in its turn, drives the power amplifier 12 representing the output stage of the "combo chip" 23. The power amplifier 12 converts the single-ended signal from the output 27 of the error amplifier 11 into a differential signal to drive the VCM 4. The power amplifier 12 drives directly the VCM 4 to move the read/write head over the disk surface. The current into the VCM 4 is then sensed across the sense resistor R5. The current sense amplifier 13 is generally a closed loop amplifier with fixed DC gain to convert the differential voltage across the sense resistor into a single-ended voltage.

The loop comprising the summer 10, the error amplifier 11, the power amplifier 12, the VCM 4 and the current sense amplifier 13 constitutes the current control loop. The analog signal at the first input of the summer 10 is setting the current to be regulated into the Voice Coil Motor 4. According to this embodiment the sigma-delta modulator is implemented in software in the controller chip 22.

Figure 9:
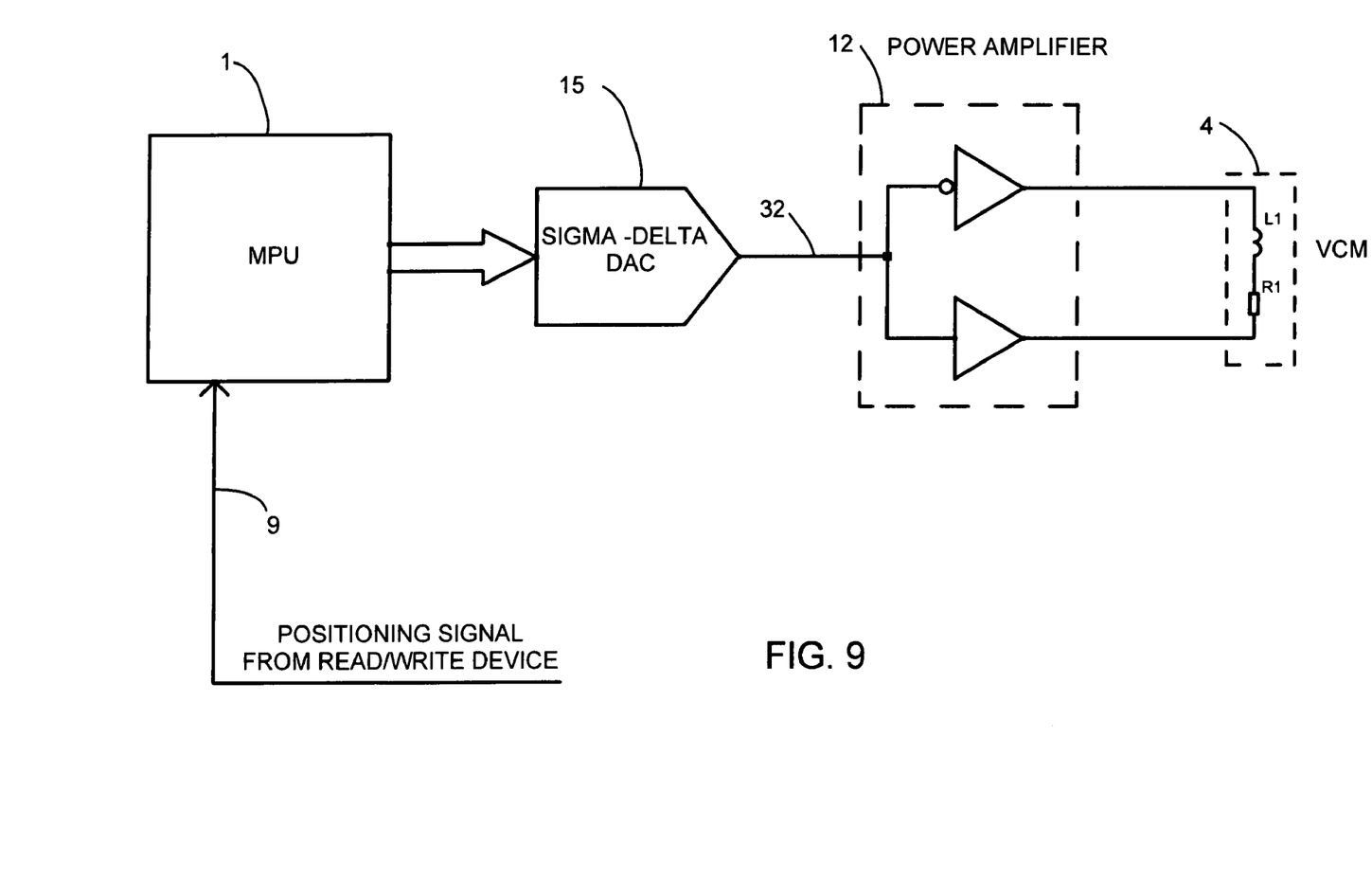
FIG. 9 is a block diagram showing the VCM driver section of the servo loop including the sigma-delta converter wherein the VCM current control loop is removed and the VCM is driven in "voltage mode" transferring the VCM positioning control directly to the outer servo loop.

G. FIG. 9

FIG. 9 shows one alternative embodiment of the present invention for the VCM driver section of the positioning servo loop including the sigma-delta converter 15 wherein the VCM current control loop is removed and the VCM 4 is driven in "voltage mode" transferring the VCM positioning control directly to the outer servo loop.

The VCM driver section of the positioning servo loop shown in FIG. 9 comprises a microprocessor 1, a sigma-delta digital to analog converter 15, a power amplifier 12 and a VCM 4. The sigma-delta converter 15, according to this embodiment, drives directly the power amplifier 12 which, in its turn, actuates the VCM 4.

The sigma-delta converter 15 is used in place of the more conventional multi-bit DAC (also known as Nyquist-rate DAC) in its various configurations, typically part of the "combo chip", or the PWM DAC implemented in the controller chip with an external low pass filter. The output signal 32 of the sigma-delta converter 15, that in this embodiment represents the analog value of the voltage to be applied to the VCM in order to determine the position of the VCM, is typically in the form of a bitstream signal. The microprocessor 1 processes the head-positioning signal 9 from a read/write channel device.

According to this general embodiment, the VCM current control loop is not present and the VCM positioning control is transferred to the outer servo loop. That implies that entire positioning servo loop can be simplified significantly and that the servo control algorithm within the microprocessor has to be modified to take into account the fact that the VCM is driven in "voltage mode" and that the resulting current is dynamically resulting from the VCM electrical parameters like its intrinsic resistance, inductance and back electromotive force in the various kinetic conditions.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A motor positioning servo loop comprising:
    a microcontroller device;
    a digital to analog converter, having a digital input and an analog output, said digital input receiving digital signal from said microcontroller device and said analog output coupled to a motor actuator;
    a motor coupled to said motor actuator;
    a detecting device, having a digital output, said digital output coupled to said microcontroller;
    wherein said detecting device detects a physical parameter comprising at least one member of the group consisting of position, velocity and acceleration;
    wherein said motor actuator receives an analog signal from said digital to analog converter and delivers electrical energy to said motor;
    wherein said digital to analog converter is an oversampling digital to analog converter, comprising a digital oversampling modulator, whose output signal is a bitstream analog signal, and
    whereby said microcontroller receives a commanding digital signal from a commanding source and a feedback digital signal from said digital output of said digital output of said detecting device and processes the digital data to drive said motor actuator in response to said commanding digital signal and said feedback digital signal to control said physical parameter.

2. The motor positioning servo loop of claim 1 wherein said motor is a Hard Disk Drive voice coil motor (VCM).

3. The motor positioning servo loop of claim 1 wherein said motor actuator is an optical data storage device actuator.

4. The motor positioning servo loop of claim 1 wherein said oversampling digital to analog converter is a sigma-delta bitstream digital to analog converter.

5. The motor positioning servo loop of claim 1 wherein said digital oversampling modulator of said oversampling digital to analog converter is implemented in hardware within said microcontroller.

6. The motor positioning servo loop of claim 1 wherein said digital oversampling modulator of said oversampling digital to analog converter is implemented in software within said microcontroller.

7. A method for achieving accurate control of the physical parameters of a system, by means of a motor positioning servo loop comprising:
   measuring the value of said physical parameters of said system;
   generating a motor control servo signal responsive to the difference between said value of said physical parameters of said system and a desired value;
   generating an oversampled bitstream analog signal responsive to said motor control servo signal;
   controlling said system by means of driving a motor in response to said oversampled bitstream analog signal;
   wherein said physical parameters are at least one member of the group consisting of position, velocity, acceleration, and pressure; and
   whereby the resolution and dynamic range of said motor positioning servo loop is increased by means of noise shaping of said oversampled bitstream analog signal.

8. The method of claim 7 wherein said system is a Hard Disk Drive data read and write head positioning system.

9. The method of claim 7 wherein said system is an optical data storage data read and write head positioning system.

10. The method of claim 7 wherein said oversampled bitstream analog signal is generated by means of a sigma-delta bitstream digital to analog modulator.

11. The method of claim 7 wherein said oversampled bitstream analog signal is generated by means of a digital oversampling modulator implemented in hardware within a microcontroller.

12. The method of claim 7 wherein said oversampled bitstream analog signal is generated by means of a digital oversampling modulator implemented in software within a microcontroller.

* * * * *